United States Patent [19]

Bergemont

[11] Patent Number: 5,566,106

[45] Date of Patent: Oct. 15, 1996

[54] METHOD FOR REDUCING THE SPACING BETWEEN THE HORIZONTALLY-ADJACENT FLOATING GATES OF A FLASH EPROM ARRAY

[75] Inventor: Albert Bergemont, San Jose, Calif.

[73] Assignee: National Semiconductor Corporation, Santa Clara, Calif.

[21] Appl. No.: 430,320

[22] Filed: Apr. 28, 1995

Related U.S. Application Data

[63] Continuation of Ser. No. 197,737, Feb. 17, 1994, abandoned.

[51] Int. Cl.[6] .......................... H01L 27/115; H01L 21/82; H01L 21/22
[52] U.S. Cl. ......................... 365/185.33; 365/185.01; 365/182; 365/185.1; 257/315; 257/316; 257/319
[58] Field of Search ............................ 365/51, 182, 185; 257/314, 401; 437/43

[56] References Cited

U.S. PATENT DOCUMENTS

| | | | |
|---|---|---|---|
| 4,851,365 | 7/1989 | Jeuch | 437/43 |
| 4,868,619 | 9/1989 | Mukherjee et al. | 357/23.5 |
| 5,011,787 | 4/1991 | Jeuch | 437/52 |
| 5,120,670 | 6/1992 | Bergemont | 437/43 |
| 5,212,541 | 5/1993 | Bergemont | 257/319 |
| 5,284,784 | 2/1994 | Manley | 437/43 |

FOREIGN PATENT DOCUMENTS

| | | | |
|---|---|---|---|
| 0299853 | 1/1989 | European Pat. Off. | H01L 27/10 |
| 0351316 | 1/1990 | European Pat. Off. | H01L 21/82 |
| 0388060 | 9/1990 | European Pat. Off. | H01L 21/82 |
| 0503205 | 9/1992 | European Pat. Off. | H01L 27/115 |

Primary Examiner—Viet Q. Nguyen
Attorney, Agent, or Firm—Limbach & Limbach L.L.P.

[57] ABSTRACT

The spacing between the horizontally-adjacent floating gates of a "T-shaped" flash electrically programmable read-only-memory (EPROM) array is reduced beyond that which can be photolithographically obtained with a given process by covering the layer of polysilicon that forms the floating gates with two sacrificial layers, exposing strips of the polysilicon layer with a standard photolithographic process, forming spacers that protect a portion of the exposed polysilicon layer, and then etching the layer of polysilicon that remains exposed.

2 Claims, 5 Drawing Sheets

METHOD FOR REDUCING THE SPACING BETWEEN THE HORIZONTALLY-ADJACENT FLOATING GATES OF A FLASH EPROM ARRAY

This is a continuation of application Ser. No. 08/197,737 filed on Feb. 17, 1994 now abandoned.

BACKGROUND OF THE INVENTION

1. Field of the Invention

The present invention relates to electrically programmable read only memories (EPROMs) and, in particular, to a method for reducing the spacing between the horizontally-adjacent floating gates of the storage cells in a flash EPROM array.

2. Discussion of the Related Art

A flash electrically programmable mad-only-memory (EPROM) is a non-volatile memory that, like conventional EPROMs, retains data which has been stored in the memory when power is removed and which, unlike conventional EPROMs, can be selectively erased.

FIG. 1 shows a plan view of a portion of a conventional "T-shaped" flash EPROM array 10. As shown in FIG. 1, array 10 includes a series of memory cells 12 and a series of field oxide regions FOX which isolate the horizontally-adjacent memory cells of the array. In addition, each memory cell 12 in a row of memory cells shams a common source bit line CSBL with the remaining memory cells 12 in the row, and with the memory cells 12 in a vertically-adjacent row of memory cells. Each memory cell 12 also shares a common drain contact 14 with one vertically-adjacent memory cell 12.

FIG. 2 shows a cross-sectional diagram taken along lines 1A—1A of FIG. 1 that illustrates the structure of an individual memory cell 12. As shown in FIG. 2, each memory cell 12 includes a floating gate 16 and a composite layer of oxide/nitride/oxide (ONO) 18 which is formed over floating gate 16. In addition, each floating gate 16 is isolated from a horizontally-adjacent floating gate 16 by a layer of edge oxide 20.

The memory cells 12 in a row of memory cells 12 are then connected together by a word line 22 which is formed over the layers of ONO 18 and the layers of edge oxide 20. As is well known, the portion of the word line 22 which is formed over each of the floating gates 16 functions as the control gate of the memory cell.

One of the major goals in the design of a T-shaped flash EPROM is to increase the density of the memory array. Historically, the density of the array has been increased by photolithographically reducing the area consumed by each cell of the array as measured by the pitch of the cells in the X direction and the pitch of the cells in the Y direction.

The pitch of a cell in the X direction can be measured as the distance from one edge of a floating gate to the same edge of a horizontally-adjacent floating gate. Thus, as shown in FIGS. 1 and 2, the X cell pitch is partially defined by the distance $D_1$ which represents the spacing between the horizontally-adjacent floating gates 16 of the array.

As further shown in FIGS. 1 and 2, the remainder of the X cell pitch is defined by the distances $D_{2'}$ and $D_{2''}$, which represent the horizontal component of the portion of the floating gates which are formed over the adjacent field oxide regions FOX, known as the wings of the floating gates, and the distance $D_3$, which represents the channel width.

In a conventional flash EPROM fabrication process, the floating gates 16, which are formed from a layer of polysilicon (poly1), are initially defined by depositing a layer of poly1, followed by an overlying layer of dielectric material, e.g., ONO. The spacing between the horizontally-adjacent floating gates is then photolithographically defined by masking and etching the layer of dielectric material and the underlying layer of polysilicon.

Thus, when an n micron photolithographic process is utilized, where n represents the minimum feature size that can be obtained by that process, the minimum spacing between horizontally-adjacent floating gates is limited by the minimum feature size that can be photolithographically obtained with that process. For example, if a 0.6 micron photolithographic process is utilized, the minimum floating gate spacing is limited to 0.6 microns.

Further, when an n micron photolithographic process is utilized, the minimum size of both the wings and the channel width are defined by the requirements of the cell, i.e., the read current level, the gate coupling level. Thus, the X cell pitch is limited by the minimum floating gate spacing that can be photolithographically obtained, and the practical size requirements of the wings and channel of the cell.

Since the photolithographic process limits the minimum size of the floating gate spacing, rather than the requirements of the cells, there is a need for a process which can reduce the floating gate spacing beyond that which is photolithographically obtainable by a given process.

SUMMARY OF THE INVENTION

In a "T-shaped" flash electrically programmable read-only-memory (EPROM) array, the pitch of the cells in the X direction is partially defined by the spacing between the horizontally-adjacent floating gates of the array. The present invention provides a method for reducing the spacing between the horizontally-adjacent floating gates of the array beyond that which is photolithographically obtainable by a given process. By reducing the size of the floating gate spacing, the pitch of the memory cells in the X direction can be significantly reduced, thereby substantially increasing the density of the EPROM array.

In accordance with the present invention, a method of fabricating a high-density flash EPROM array begins by providing a semiconductor substrate of P-type conductivity. Next, a plurality of spaced-apart field oxide regions are formed in the semiconductor substram. Following this, the substrate is implanted to set the channel threshold voltages. After the channel threshold voltages have been set, a layer of gate dielectric material is formed on the semiconductor substrate. A layer of conductive material is then formed over the layer of gate dielectric material and the field oxide regions. The floating gates of the array will be formed from the layer of conductive material. Following this, a layer of first sacrificial material is formed over the layer of conductive material, followed by the formation of a layer of second sacrificial material over the layer of first sacrificial material. Once the layer of second sacrificial material has been formed, a plurality of strips are defined on the surface of the layer of second sacrificial material. The layer of second sacrificial material and the underlying layer of first sacrificial material defined by the plurality of strips are then etched away to form a plurality of exposed strips of conductive material. Next, a layer of insulation material is formed over the layer of second sacrificial material and the exposed strips of conductive material. This is followed by an anisotropic etch of the layer of insulation material until the layer of insulation material is removed from the surface of the second sacrificial material, and from a central portion of each exposed strip of conductive material. The anisotropic etch of the layer of insulation material produces spacers which cover the outer portions of each exposed strip of conductive material. Once the layer of insulation material has been anisotropically etched, the layer of second sacrificial material and the central portion of each exposed strip of conductive material are etched away. Following this, the remaining layer of insulation material, the spacers, and the layer of first sacrificial material are etched away.

A better understanding of the features and advantages of the present invention will be obtained by reference to the following detailed description and accompanying drawings which set forth an illustrative embodiment in which the principals of the invention are utilized.

DETAILED DESCRIPTION

FIGS. 3–9 show cross-sectional diagrams that illustrate the steps for forming the spacing between the horizontally-adjacent floating gates of a "T-shaped" flash electrically programmable read-only-memory (EPROM) array in accordance with the present invention. As described above, conventional photolithographic processes are typically utilized to define the spacing between horizontally-adjacent floating gates. As a result, the minimum spacing that can be photolithographically realized with a particular process defines the minimum floating gate spacing.

As described in greater detail below, the present invention reduces the spacing between horizontally-adjacent floating gates beyond that which can be photolithographically obtained with a particular process. By reducing the size of the floating gate spacing, the pitch of the memory cells in the X direction can be significantly reduced, thereby substantially increasing the density of the EPROM array.

Figure 1:
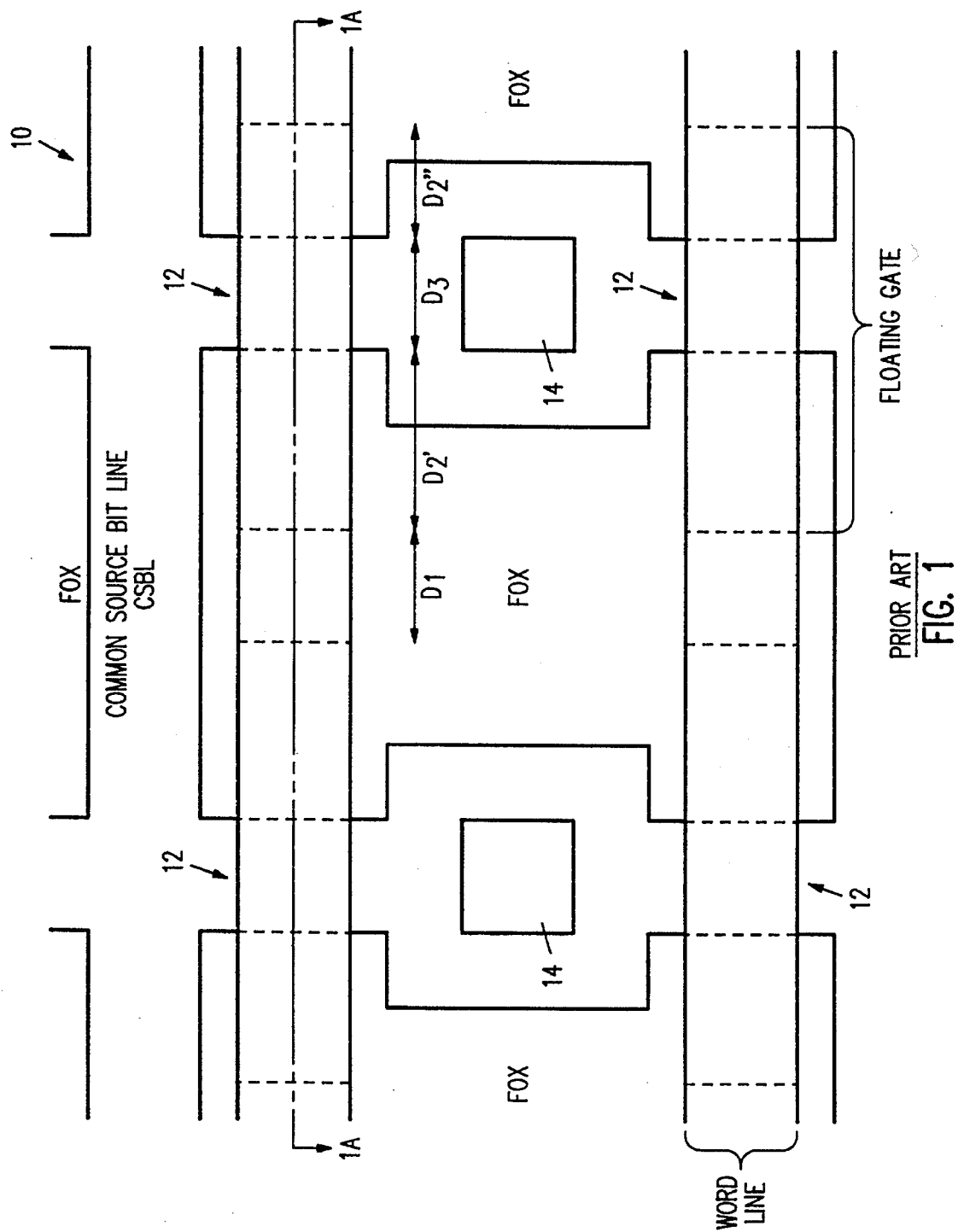
FIG. 1 is a plan view illustrating a portion of a conventional T-shaped flash EPROM array 10.
Figure 2:
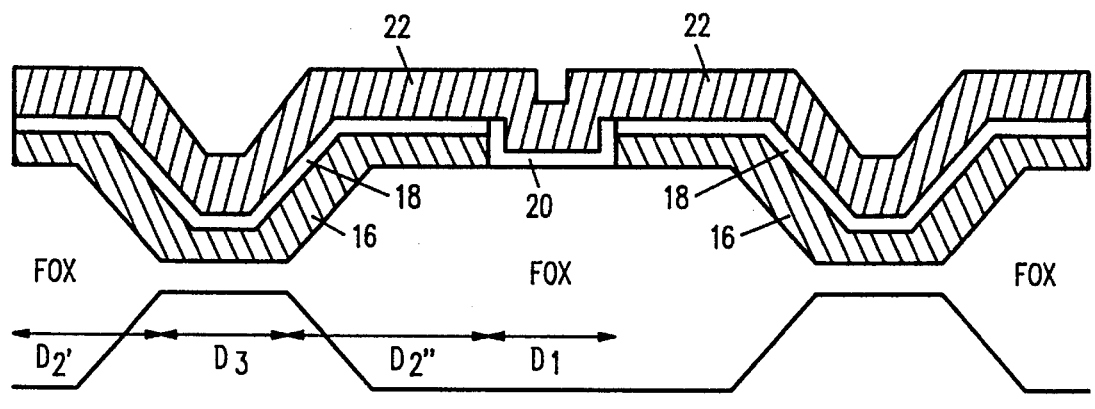
FIG. 2 is a cross-sectional diagram taken along lines 1A—1A of FIG. 1 illustrating the structure of an individual memory cell 12.
Figure 3:
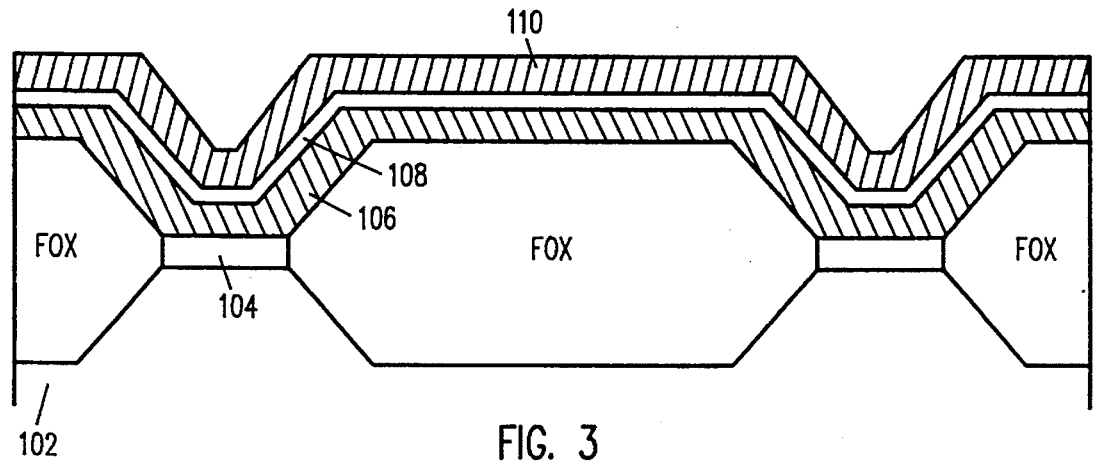
FIGS. 3–9 are cross-sectional diagrams illustrating the steps for forming the spacing between the horizontally-adjacent floating gates of a "T-shaped" flash electrically programmable read-only-memory (EPROM) array in accordance with the present invention.

The process of the present invention will now be described with respect to a 0.6 micron photolithographic process. Referring to FIG. 3, the process of the present invention begins by forming a plurality of field oxide regions FOX in a P-type semiconductor substrate 102. The plurality of field oxide regions FOX are first formed by growing a layer of pad oxide (not shown) approximately 500 Å thick over the semiconductor substrate 102. This is followed by the deposition of an overlying layer of nitride. A field oxide mask is then formed over the nitride/pad oxide composite and patterned to define the plurality of field oxide regions FOX.

Next, the unmasked areas are etched until the underlying layer of pad oxide is exposed. The field oxide mask is stripped and a field implant mask is then formed and patterned. The semiconductor substrate 102 underlying the unmasked areas is then implanted with $BF_2$ at 50 KeV to form an implant concentration of approximately $4\times10^{13}/cm^2$. Following this, the field implant mask is stripped and the resulting device is oxidized. The fabrication steps utilized to form the plurality of field oxide regions FOX are conventional and well known in the art.

After the plurality of field oxide regions FOX have been formed, the next step is to set the channel threshold voltages for the to-be-formed memory cells. The threshold voltages are first set by removing the nitride/pad oxide composite layer. Next, a first layer of sacrificial oxide (not shown) is grown on the exposed P-type semiconductor substrate 102, followed by the formation and patterning of a threshold voltage mask.

After the threshold voltage mask has been formed and patterned, the semiconductor substrate 102 underlying the unmasked areas of sacrificial oxide is then implanted with $B_{11}$ at 40 KeV to form an implant concentration of approximately $5\times10^{12}/cm^2$. Following this, the threshold voltage mask is stripped and the first layer of sacrificial oxide is removed. The fabrication steps utilized to set the channel threshold voltages are also conventional and well known in the art.

Referring again to FIG. 3, after the first layer of sacrificial oxide has been removed, a layer of gate oxide 104 approximately 100–120 Å thick is grown on the P-type semiconductor substrate 102. Next, a layer of polysilicon (poly1) 106 approximately 1,500 Å thick is deposited over the layer of gate oxide 104 and the field oxide regions FOX. The layer of poly1 106 is then doped in a conventional manner. As is well known, the floating gates of the array are formed from the layer of poly1 106.

Next, in accordance with the present invention, a second layer of sacrificial oxide 108 approximately 150 Å thick is formed over the layer of poly1 106. Following this, a sacrificial layer of polysilicon (polyS) 110 approximately 2,000 Å thick is deposited over the layer of oxide 108. The layer of polyS 110 is formed to be thicker than the layer of poly1 106 to insure that in a subsequent etching step the layer of poly1 106 will be completely removed by the time the layer of polyS 110 has been removed.

Figure 4:
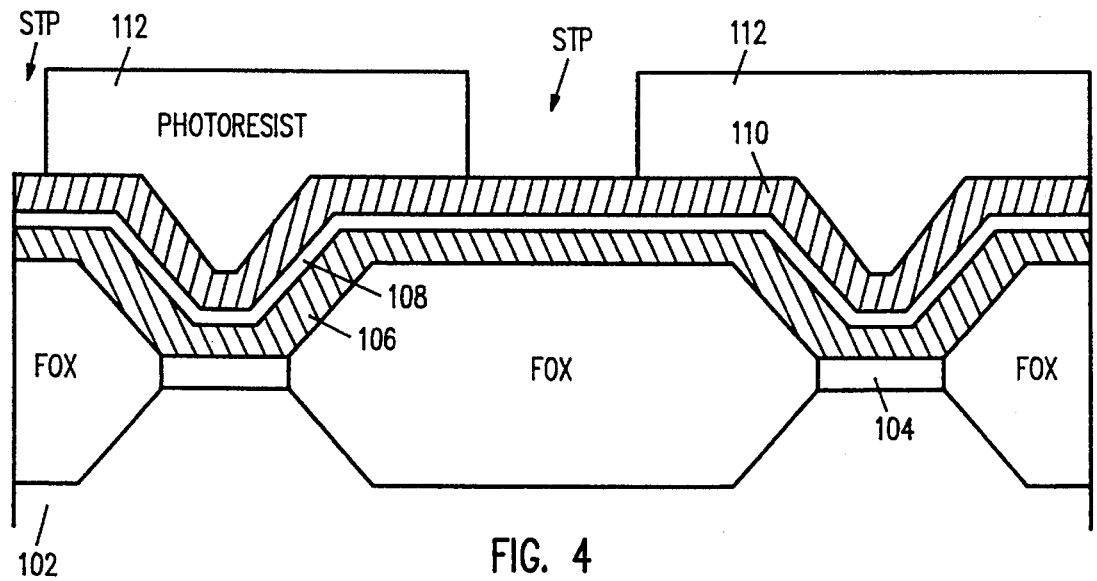
Figure 5:
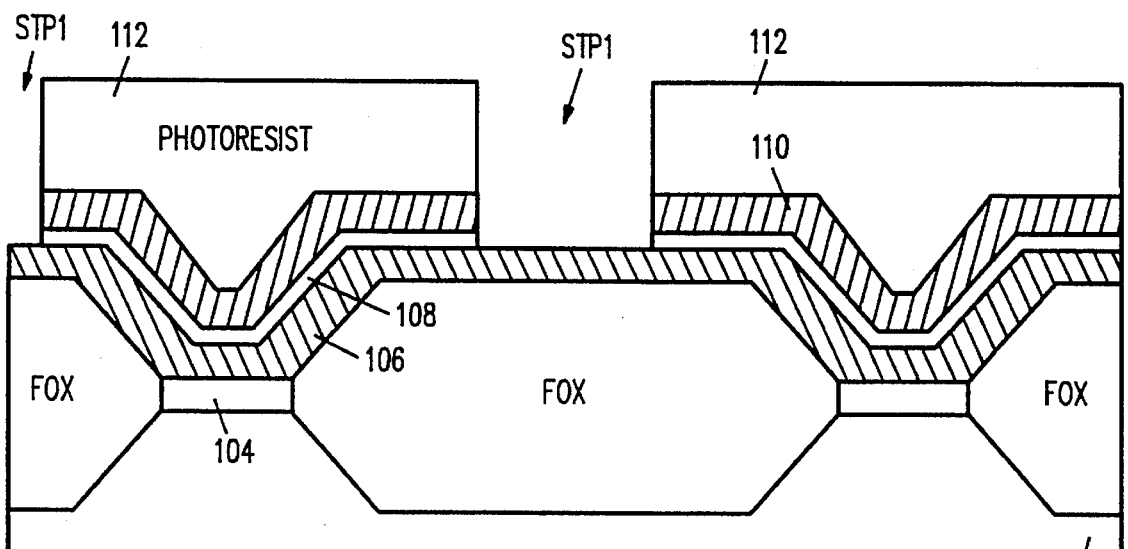

As shown in FIG. 4, after the layer of polyS 110 has been deposited, a photoresist mask 112 is formed and patterned to define a series of unmasked strips STPs approximately 0.6 microns wide on the surface of the layer of polyS 110, 0.6 microns being the minimum feature size of the 0.6 micron process being utilized. Referring to FIG. 5, the unmasked strips STP of polyS 110 and the underlying layer of sacrificial oxide 108 are then plasma etched until the underlying layer of sacrificial oxide 108 has been removed from the layer of poly1 106. As a result, a plurality of exposed strips of poly1 STP1 approximately 0.6 microns wide are formed.

Following this, mask 112 is stripped and a layer of conformally deposited oxide, such as tetra-ethyl-ortho-silicate (TEOS), approximately 0.2 microns thick is formed over the layer of polyS 110 and the exposed strips of poly1 STP1. Next, the layer of conformally deposited oxide is anisotropically etched until the layer of conformally deposited oxide is removed from the surface of the layer of polyS, and from a central portion of each exposed strip of poly1 STP1.

Figure 6:
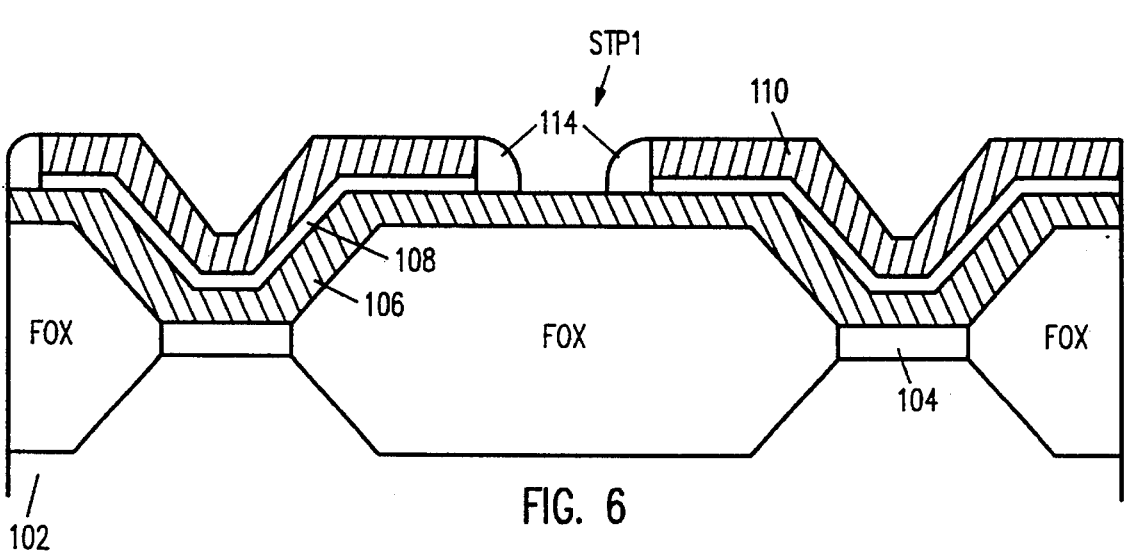

As shown in FIG. 6, the anisotropic etch of the layer of deposited oxide produces oxide spacers 114 along the sides of the layer of polyS 110 and the underlying layer of sacrificial oxide 108, and across the outer portions of each exposed strip of poly1 STP1.

Since the layer of conformally deposited oxide was formed approximately 0.2 microns thick, the oxide spacers 114 will extend approximately 0.2 microns across the surface of the exposed strips of poly1 STP1. Thus, since the unmasked strips STPs defined by mask 112 are approximately 0.6 microns wide, the central portion of each exposed strip of poly1 STP1 will be approximately 0.2 microns wide.

Figure 7:
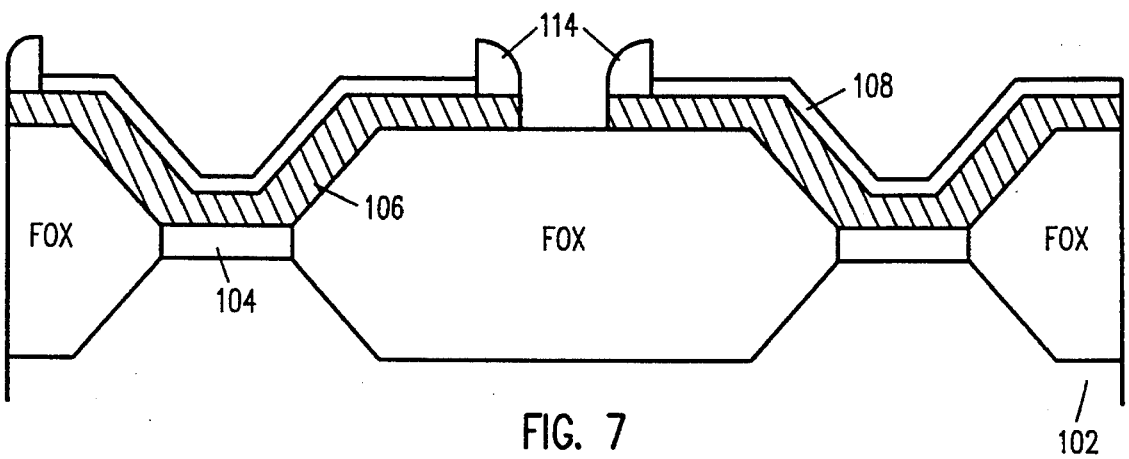

The spacing between horizontally-adjacent floating gates is then formed by anisotropically etching the central portion of each exposed strip of poly1 STP1 and the layer of polyS, as shown in FIG. 7, until the layer of polyS has been removed from the second layer of sacrificial oxide 108, and the exposed layer of poly1 has been removed from the field oxide regions FOX. Thus, by forming unmasked strips STP approximately 0.6 microns wide, and by utilizing a layer of deposited oxide approximately 0.2 microns thick, a floating gate spacing of approximately 0.2 microns can be achieved.

Although an unmasked strip STP approximately 0.6 microns wide and a layer of deposited oxide approximately 0.2 microns thick have been described, other strip widths and oxide thicknesses can equally well be utilized. For example, a 0.2 micron floating gate spacing could also be formed with unmasked strips STP which are 0.8 microns wide and a layer of deposited oxide which is 0.3 microns thick.

In most cases, however, the width of the unmasked strip STP will be defined by the minimum feature size that is photolithographically obtainable with a specific process. Thus, when an n micron photolithographic process is utilized, where n represents the minimum feature size that can be obtained with the process, along with a layer of deposited oxide which is less than n/2 microns thick, the spacing between horizontally-adjacent floating gates can be defined to be within the range of n>SP>0, where SP represents the floating gate spacing. As a result, the actual floating gate spacing utilized in a given flash EPROM array can be determined by the minimum spacing that is required to insure proper operation of the cells, and not by the minimum feature size that is photolithographically obtainable with a given process.

Figure 8:
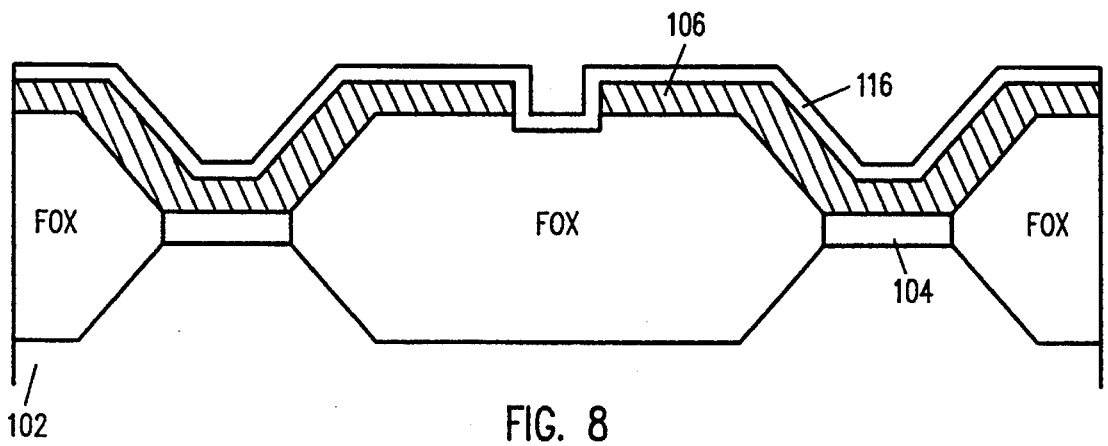

Referring to FIG. 8, after the floating gate spacing has been formed; the second layer of sacrificial oxide 108 and the oxide spacers 114 are then etched away. As shown in FIG. 8, the exposed portions of the field oxide regions FOX are etched back slightly during this etching step. Following this, a composite dielectric layer of oxide/nitride/oxide (ONO) 116 is formed over the layer of poly1 106 and the exposed portions of the field oxide regions FOX.

At this point, MOS transistors can optionally be formed around the periphery of the array. The typical flash EPROM includes a number of MOS transistors that function, for example, as current sense detectors and address decoders. Thus, when present, the next step is to form the MOS peripheral devices. When the MOS peripheral devices are not present, the next step is the formation of the word lines.

To form the peripheral MOS devices, a protect array mask is formed over the array region so that MOS transistors can be formed around the periphery of the array. Following the formation of the protect array mask, the layer of ONO 116 and the layer of gate oxide 104 are etched from the periphery. Once the layer of gate oxide 104 has been removed, a layer of second gate oxide (not shown) approximately 200 Å is grown on the P-type semiconductor substrate in the periphery. After the layer of second gate oxide has been grown, the next step is to set the channel threshold voltages for each of the to be formed MOS transistors in the periphery.

The threshold voltages are set by forming and patterning a threshold mask, and then implanting a P-type dopant through the unmasked layer of second gate oxide. Following this, the threshold voltage mask and the protect array mask are stripped.

Figure 9:
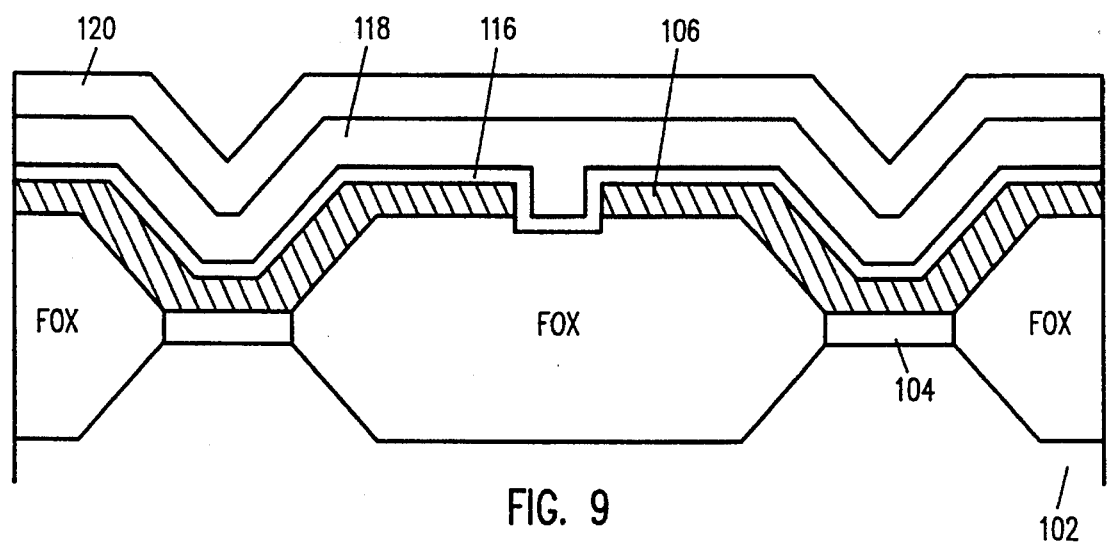

Referring to FIG. 9, after the peripheral MOS devices have been formed, a layer of second polysilicon (poly2) 118 approximately 1,500 Å is deposited over the surface of the entire device and doped in a conventional manner. In the preferred embodiment, this is followed by the deposition of an overlying layer of tungsten silicide 120 approximately 2,000 Å thick. As is well known, the control gates of the cells are formed by the portion of the composite layer of tungsten silicide/poly2 that is formed over the floating gates.

A word line mask (not shown) is then formed over the tungsten silicide/poly2 composite and patterned to define the series of word lines in the array and the gate electrodes of the peripheral MOS devices. Following this, the tungsten silicide/poly2 composite is etched until the unmasked layers of tungsten silicide, and poly2 have been removed.

After the tungsten silicide/poly2 composite has been etched, the word line mask is UV-hardened and a self-aligned etch (SAE) mask is formed so that the overlying tungsten silicide/poly2 composite can be used as a mask for a self-aligned etch of the ONO/poly1 composite. This then is followed by a stacked etch of the ONO/poly1 composite to define each of the to-be-formed memory cells of the array.

After the self-aligned etch of the ONO/poly1 composite, the SAE mask is removed. Next, a source/drain mask (not shown) is formed and patterned to define the N+drain regions and the series of common source bit lines in the array, and the N+source and drain regions of the MOS devices in the periphery. Once the source/drain mask has been formed, the P-type semiconductor substrate 102 underlying the unmasked areas is implanted with arsenic through the layer of first gate oxide 104 to a depth of 0.2 to 0.3 microns. The source/drain mask is then stripped.

Next, a common source mask is formed and patterned. The common source bit lines are then implanted with a high voltage phosphorous implant. Following this, the process follows conventional steps.

Thus, in accordance with the present invention, the floating gate spacing can be reduced beyond that which can be photolithographically obtained with a particular process by covering the layer of polysilicon that forms the floating gates with two sacrificial layers, exposing strips of the polysilicon layer with a standard photolithographic process, forming spacers that protect a portion of the exposed polysilicon layer, and then etching the layer of polysilicon that remains exposed. As a result, the pitch of the memory cells in the X direction can be significantly reduced.

Figure 10:
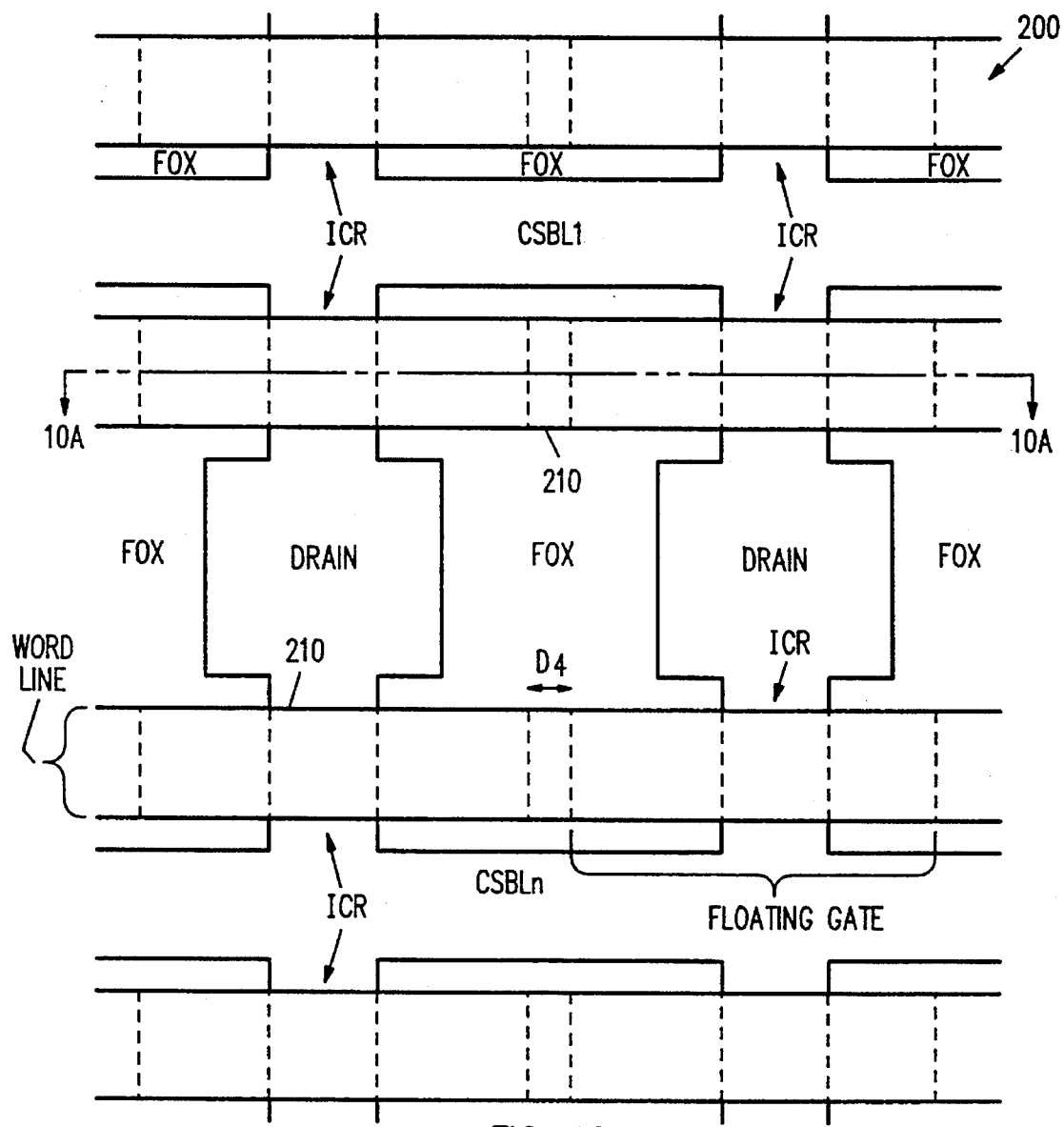
FIG. 10 is a plan diagram illustrating a portion of a flash EPROM array 200 which has been formed with an n micron photolithographic process where n represents the minimum feature size that can be obtained by the process.
Figure 11:
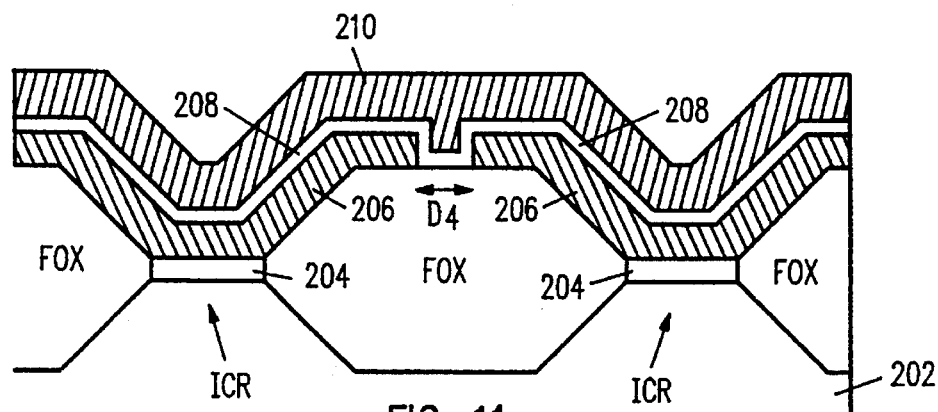
FIG. 11 is a cross-sectional diagram taken along line 10A—10A of FIG. 10.

FIG. 10 shows a plan diagram that illustrates a portion of a flash EPROM array 200 which has been formed with an n micron photolithographic process where n represents the minimum feature size that can be obtained with the process. FIG. 11 shows a cross-sectional diagram taken along line 10A—10A of FIG. 10.

As shown in FIGS. 10 and 11, flash EPROM array 200 includes a plurality of field oxide regions FOX which are formed on a semiconductor substrate 202 of P-type conductivity. Flash EPROM array 200 also includes a plurality of implanted channel regions ICRs which are formed in the semiconductor substrate 202 so that a pair of implanted channel regions ICRs are formed between and adjoin each pair of horizontally-adjacent field oxide regions FOX. Each implanted channel region ICR has a first side and a second side.

Flash EPROM array 200 additionally includes a plurality of N+drain regions DRAIN which are formed in the semiconductor substrate so that each drain region DRAIN adjoins the first side of each pair of implanted channel regions ICRs that are formed between each pair of horizontally-adjacent field oxide regions.

As further shown in FIG. 10, a series of N+common source bit lines CSBL1-CSBLn are formed in the semiconductor substram 202 so that the second side of each implanted channel region ICR formed in one row of implanted channel regions ICRs and the second side of each implanted channel region ICR formed in an adjacent row of implanted channel regions ICRs are adjoined by one common source bit line CSBL.

Array 200 also includes a layer of gate dielectric material 204 and a plurality of floating gates 206. As shown in FIG. 11, the layer of gate dielectric material 204 is formed over the semiconductor substrate 202. Further, the plurality of floating gates 206 are formed on the layer of gate dielectric material 204 so that each floating gate 206 is formed over one implanted channel region ICR and a portion of each of the adjoining field oxide regions FOX. In accordance with the present invention, each floating gate 206 is separated from a horizontally-adjacent floating gate 206 by a floating gate spacing $D_4$ that is less than n microns.

Array 200 additionally includes a plurality of strips of a composite layer of oxide/nitride/oxide (ONO) 208, and a plurality of word lines 210. Each of the floating gates 206 in a row of floating gates 206 is connected together by one strip of ONO 208. Further, each word line 210 is formed over one strip of ONO 208.

It should be understood that various alternatives to the embodiment of the invention described herein may be employed in practicing the invention. It is intended that the following claims define the scope of the invention and that methods and structures within the scope of these claims and their equivalents be covered thereby.

What is claimed is:

1. A high-density flash electrically programmable read-only-memory (EPROM) array formed in a semiconductor substrate of P-type conductivity, the EPROM comprising:

a plurality of spaced-apart field oxide regions formed in the semiconductor substrate;

a plurality of implanted channel regions formed in the semiconductor substrate so that a pair of implanted channel regions is formed between and adjoins each pair of horizontally-adjacent field oxide regions;

a layer of gate dielectric material formed on the semiconductor substrate; and a plurality of floating gates formed on the layer of gate dielectric material with an n micron photolithographic process so that each floating gate is formed over one implanted channel region and a portion of each adjoining field oxide region, each floating gate being separated from a horizontally-adjacent floating gate by less than n microns, where n represents the minimum feature size that can be photolithographically obtained with said photolithographic process.

2. A high-density flash electrically programmable read-only-memory (EPROM) array formed by the process of claim 1.

* * * * *